United States Patent [19]

Cooperman et al.

[11] 4,408,133

[45] Oct. 4, 1983

[54] COMPARATOR CIRCUIT WITH IMPROVED RELIABILITY AND/OR SPEED

[75] Inventors: Michael Cooperman; William L. Geller, both of Framingham, Mass.

[73] Assignee: GTE Laboratories Incorporated, Waltham, Mass.

[21] Appl. No.: 249,036

[22] Filed: Mar. 30, 1981

[51] Int. Cl.³ .............................................. H03K 5/153
[52] U.S. Cl. .................................. 307/362; 328/146; 328/151; 307/297
[58] Field of Search ............... 307/530, 350, 352, 355, 307/362, 238.6, 238.8, 247 R, 363; 328/146, 151, 195

[56] References Cited

U.S. PATENT DOCUMENTS

| 3,983,412 | 9/1976 | Roberts et al. | 307/530 |
| 4,121,120 | 10/1978 | Wetterling | 307/352 |
| 4,150,311 | 4/1979 | Matsuda et al. | 307/355 |

*Primary Examiner*—Larry N. Anagnos
*Assistant Examiner*—David R. Bertelson
*Attorney, Agent, or Firm*—Fred Fisher

[57] ABSTRACT

A comparator circuit of one type, prior to this invention, had a reliability problem due to an undesirable conductive path, and had limited speed due to stray capacitances. Reliability is achieved through separate triodes for coupling an inverted storage pulse to a primary electrode of each of two triodes of a differential amplifier. Speed is achieved through coupling a transistor across the other primary electrodes of the differential amplifier, the transistor's gate electrode receiving a narrow pulse upon termination of the storage pulse.

10 Claims, 2 Drawing Figures

COMPARATOR CIRCUIT WITH IMPROVED RELIABILITY AND/OR SPEED

BACKGROUND OF THE INVENTION

1. Field of the Invention

This invention relates to a comparator circuit. Accordingly, it is a general object of this invention to provide new and improved comparator circuits of such character.

2. Description of the Prior Art

A comparator circuit of one type, prior to this invention, had a reliability problem due to an undesirable conductive path and had a limited speed due to stray capacitances at certain junctions in the circuit. Such a comparator circuit will become more apparent from the description of the invention.

SUMMARY OF THE INVENTION

Another object of the invention is to provide a new and improved comparator circuit which is more reliable than similar comparator circuits of the prior art.

Yet another object of the invention is to provide a new and improved comparator circuit having a higher speed of operation than similar comparator circuits of the prior art.

In accordance with one embodiment, the invention is directed to an improved comparator circuit utilizing a plurality of triodes, each of the triodes having a pair of primary electrodes and one control electrode. A first differential amplifier has one primary electrode of a first triode and one primary electrode of a second triode coupled together. They are adapted to be coupled to a negative potential source via a first conductive medium. One control electrode of the first triode is adapted to receive an analog input signal. One control electrode of the second triode is adapted to be coupled to a point of reference potential. A third triode is connected as a resistive load for coupling a positive potential source to a second primary electrode of a first triode. A fourth triode is connected as a resistive load for coupling the positive potential source to a second primary electrode of the second triode. A second differential amplifier has one primary electrode of a fifth triode and one primary electrode of a sixth triode coupled via suitable means and adapted to be coupled to the negative potential source via a second conductive medium. One control electrode of the fifth triode is coupled to the second primary electrode of the first triode. One control electrode of the sixth triode is coupled to the second primary electrode of the second triode. A seventh triode is connected as a resistive load for coupling the positive potential source to a second primary electrode of the fifth triode. An eighth triode is connected as a resistive load for coupling the positive potential source to a second primary electrode of the sixth triode. A latch has one primary electrode of a ninth triode and one primary electrode of a tenth triode coupled together to a primary electrode of an eleventh triode. A second primary electrode of the eleventh triode is adapted to be coupled to the negative potential source via the second conductive medium. One control electrode of the ninth triode is coupled to a second primary electrode of the tenth triode. One control electrode of the tenth triode is coupled to a second primary electrode of the ninth triode. The second primary electrode of the ninth triode is coupled to the second primary electrode of the fifth triode. The second primary electrode of the tenth triode is coupled to the second primary electrode of the sixth triode. The second primary electrode of the tenth triode is adapted to provide a digital output therefrom.

A switching circuit includes means for receiving a storage pulse for coupling one control electrode of the eleventh triode and means for coupling an inverted form of the storage pulse to the suitable means to tend to disable such suitable means. The improvement in the embodiment resides in the suitable means which comprises a twelfth triode which has one control electrode coupled to receive the inverted form of the storage pulse, a first primary electrode coupled to the negative potential source via the second conductive medium, and a second primary electrode coupled to the one primary electrode of the fifth triode. A thirteenth triode has one control electrode coupled to receive the inverted form of the storage pulse, a first primary electrode coupled to the negative potential source via the second conductive medium, and a second primary electrode coupled to the one primary electrode of the sixth triode. In accordance with certain features of the invention, the triodes can be solid state and they can be MOSFETs.

In accordance with another embodiment of the invention, the foregoing embodiment can further include a fourteenth triode which has a first primary electrode coupled to the second primary electrode of the fifth triode. A second primary electrode is coupled to the second primary electrode of the sixth triode and a control electrode is coupled to receive a trigger pulse upon the termination of the storage pulse. In accordance with certain features of the invention, the triodes can be solid state and can be MOSFETs.

In accordance with another embodiment, the invention is directed to an improved comparator circuit which utilizes a plurality of triodes, each of which has a pair of primary electrodes and one control electrode. The circuit includes a first differential amplifier having one primary electrode of a first triode and one primary electrode of a second triode coupled together. They are adapted to be coupled to a negative potential source via a first conductive medium. One control electrode of the first triode is adapted to receive an analog input signal; one control electrode of the second triode is coupled to a point of reference potential. A third triode is connected as a resistive load for coupling a positive potential source to a second primary electrode of the first triode. A fourth triode is connected as a resistive load for coupling the positive potential source to a second primary electrode of the second triode. A second differential amplifier has one primary electrode of a fifth triode and one primary electrode of a sixth triode coupled via electronically controlled means for coupling to the negative potential source via a second conductive medium. One control electrode of the fifth triode is coupled to the second primary electrode of the first triode. One control electrode of the sixth triode is coupled to the second primary electrode of the second triode. A seventh triode is connected as a resistive load for coupling the positive potential source to a second primary electrode of the fifth triode, and an eighth triode is connected as a resistive load for coupling the positive potential source to a second primary electrode of the sixth triode. A latch has one primary electrode of a ninth triode and one primary electrode of a tenth triode coupled together to one primary electrode of an eleventh triode. A second primary electrode of the eleventh triode is adapted to be coupled to the negative potential source via the second conductive medium. One control electrode of the ninth triode is coupled to a second primary electrode of the tenth triode. One control electrode of the tenth triode is coupled to a second primary electrode of the ninth triode. The second primary electrode of the ninth triode is coupled to the second primary electrode of the fifth triode. The second primary electrode of the tenth triode is coupled to the second primary electrode of the sixth triode. The second primary electrode of the tenth triode is adapted to provide a digital output therefrom. A switching circuit includes means for receiving a storage pulse for coupling to one control electrode of the eleventh triode and means for coupling an inverted form of the storage pulse to the electronically controlled means to inhibit current conduction therethrough. The improvement in such circuit comprises an additional triode which has a first primary electrode coupled to the second primary electrode of the fifth triode and a second primary electrode coupled to the second primary electrode of the sixth triode, and a control electrode coupled to receive a trigger pulse upon termination of the storage pulse. In accordance with certain features of the invention, the triodes are solid state and they can be MOSFETs. In accordance with yet another feature of the invention, the control electrodes are gate electrodes, one primary electrode of each of the triodes is a source electrode, and the other primary electrode of each of the triodes is a drain electrode.

BRIEF DESCRIPTION OF THE DRAWINGS

Other objects, advantages and features of this invention, together with its construction and mode of operation, will become more apparent with the following description, when read in conjunction with the accompanying drawing, in which.

DESCRIPTION OF PREFERRED EMBODIMENT(s)

The invention, as stated above, relates to a comparator circuit having improved reliability and speed compared to other prior art comparator circuits. The reliability improvement is obtained by eliminating an undesirable conductive path. The speed improvement is obtained by a quick discharge of stray capacitors. Comparators of this type are especially useful in codecs (coders/decoders) to obtain analog-to-digital conversion and digital-to-analog conversion.

Figure 1:
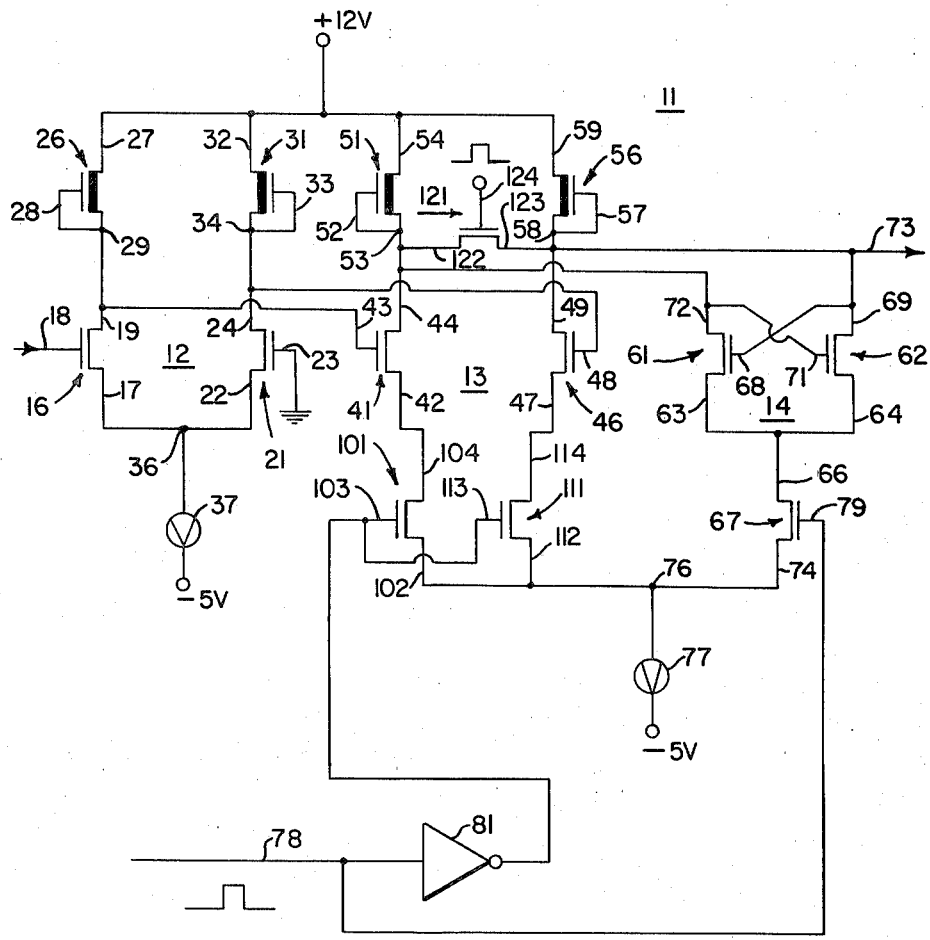
FIG. 1 is a circuit diagram of one embodiment of the invention.

Referring to FIG. 1, the comparator 11 includes two differential amplifiers 12,13 and a latch 14.

The comparator comprises a plurality of triodes, preferably solid state devices such as MOSFETs (metal oxides semiconductor field effect transistors). In one version, all the MOSFETs, or semiconductor devices, can be incorporated on one integrated circuit chip.

The differential amplifier 12 includes a first triode 16 (which, as stated above, can be a MOSFET) having a first primary electrode 19 such as a drain, a control electrode 18 such as a gate, and a second primary electrode 17 such as a source. The first differential amplifier 12 further includes a second triode 21 (which can be a MOSFET) including a first primary electrode 24 such as a drain, a first control electrode 23 such as a gate, and a second primary electrode 22 such as a source.

A "pull-up" load 26 (which can be a resistive load) is formed with a MOSFET transistor having its drain electrode 27 coupled to a positive potential source, such as +12 volts, and having its gate electrode 28 coupled to a source electrode 29. The source electrode 29 of the MOSFET 26 is coupled to the drain electrode 19 of the MOSFET transistor 16. In similar fashion, a MOSFET transistor 31 has its drain electrode 32 coupled to a point of positive potential, such as +12 volts, with its gate electrode 33 coupled to the source electrode 34. The source electrode 34 of the MOSFET 31 is coupled to the drain electrode 24 of the MOSFET 21.

The gate 18 of the MOSFET 16 is coupled so as to receive an analog input signal. The gate 23 of the MOSFET 21 is coupled to a point of reference potential, such as ground. The source 17 of the MOSFET 16 and the source 22 of the MOSFET 21 are coupled together at a junction point 36 and are adapted to be coupled via a first conductive medium 37 to a negative potential source, such as −5 volts.

A second differential amplifier includes a fifth triode 41 having one primary (source) electrode 42 and a control (gate) electrode 43 coupled to the drain electrode 19 of the triode 16. The triode 41 is further provided with another primary (drain) electrode 44. The second differential amplifier further includes a sixth triode 46 having a primary (source) electrode 47 and a control (gate) electrode 48 coupled to the drain 24 of the triode 21 and further includes another primary (drain) electrode 49.

The drain 44 of the triode 41 is coupled to a resistive load formed from a MOSFET 51 having its gate electrode 52 coupled to its source 53. The source 53 is coupled to the drain 44 of the triode 41. Another primary (drain) electrode 54 of the MOSFET 51 is coupled to a point of positive potential, such as +12 volts. An eighth triode 56 has its gate 57 connected to its source electrode 58, the source electrode 58 of the MOSFET 56 being coupled to the drain 49 of the triode 46. A second primary (drain) electrode 59 of the triode 56 is coupled to a point of positive potential, such as +12 volts.

A latch 14 includes a ninth triode 61 and a tenth triode 62. One primary electrode 63 of the triode 61 is coupled to one primary electrode 64 of the triode 62 and coupled together to a drain electrode 66 of an eleventh triode 67. A gate electrode 68 of the triode 61 is coupled to a drain electrode 69 of the triode 62. In similar fashion, a gate electrode 71 of the triode 62 is connected to a drain electrode 72 of the triode 61. The drain electrode 72 of the triode 61 is coupled to the drain electrode 44 of the triode 41. The drain electrode 69 of the triode 62 is coupled to the drain electrode 49 of the triode 46. A digital output signal is provided along a line 73 which is coupled to the drain electrode 69 of the triode 62.

The eleventh triode 67 has one primary (source) electrode 74 coupled at a point 76 to a current source 77 to a −5 volts negative potential source.

A storage pulse, such as the positive pulse, as depicted in FIG. 1, can be coupled along a line 78 to a gate electrode 79 of the triode 67. The pulse on the line 78 can be inverted by an inverter 81 and applied to control suitable means coupled to the source electrode 42 of the transistor 41 and the source electrode 47 of the transistor 46 so as to inhibit current flow thereto between such drain electrodes and the junction point 76.

Figure 2:
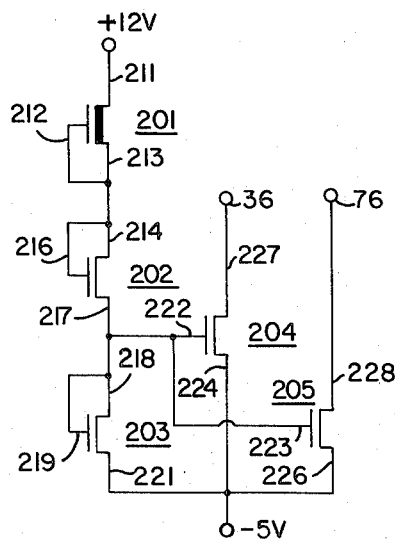
FIG. 2 is a circuit diagram of current sources for use in conjunction with the circuit diagram of FIG. 1.

A suitable current source 37 and a suitable current source 77 are depicted generally in FIG. 2. FIG. 2 illustrates five MOSFETs 201, 202, 203, 204, 205 coupled together to form current sources. A drain electrode 211 of the MOSFET 201 is coupled to a positive potential source, such as +12 volts. A gate electrode 212 of the MOSFET 201 is coupled to a source electrode 213 thereof. The source electrode 213 of the MOSFET 201 is coupled to a drain electrode 214 of the MOSFET 202, the drain electrode 214 being connected to a gate electrode 216 thereof. A source electrode 217 of the MOSFET 202 is coupled to a drain electrode 218 of the MOSFET 203 and also to a gate electrode 219 thereof. A source electrode 221 of the MOSFET 203 is coupled to a negative potential source, such as −5 volts. The source electrode 217 of the MOSFET 202 is coupled to a gate electrode 222 of the MOSFET 204 and is also coupled to a gate electrode 223 of the MOSFET 205. The source electrode 224 of the MOSFET 204, and the source electrode 226 of the MOSFET 205 are coupled to a negative potential source, such as −5 volts. The drain electrode 227 of the MOSFET 204 is coupled to the junction point 36, while the drain electrode 228 is coupled to the junction point 76.

In operation, the analog input applied to the gate 18 of the first triode 16 of the first differential amplifier 12 is compared against ground potential by the differential transistors 16 and 21, with the transistors 26 and 31 forming the loads for the transistors 16 and 21, respectively. The differential voltage which appears between the electrodes 19 and 24 (an amplified version of the analog input) is directed to be applied through differential amplifier 13 to the latch 14 for storage in the transistors 61 and 62. The storage is accomplished by applying a positive pulse, as illustrated, which turns on the transistor 67 and turns off the electronically controlled means, as stated hereinabove. The transistors 61, 62 flip to a state which is determined by the voltage difference on the drain electrodes 44, 49 of the second differential amplifier 13.

In order for the foregoing circuit to operate reliably with variations in temperature, power supply, and device perimeters, the digital output of the latch should have a nominal value for a logical "1" and a logical "0", substantially separate from each other. For example, in a preferred embodiment, a digital output of the latch has a nominal value of about +4 volts for a logical "1" and a nominal value of about −4 volts for a logical "0".

It is further desirable for the circuit to operate at high speed. The frequency with which successive comparisons can be made with accuracy and sensitivity depends on the recovery time of the differential voltage stored on the stray capacitance of the drain electrodes 44, 49 when the pulse applied on the line 78 returns to its low state. As stated hereinabove, an object of this invention is to improve reliability and speed of conventional comparator circuits.

In a conventional comparator circuit, the source electrodes 42, 47 of the triodes 41, 46, respectively, would be coupled together to one primary electrode of a triode, such as a MOSFET, with the other primary electrode being coupled to the junction point 76. The control electrode of that latter triode would receive the output of the inverter 81. However, with such connection, the transistors or triodes 41, 46 would provide an undesirable conductive path between the drain electrode 44 and the drain electrode 49 when the triode 67 is conducting and the latch 14 is activated. This is due to the voltage on the drain electrode 19 and the drain electrode 24 being at approximately zero volt which causes the triode 41 to conduct (the voltage at the drain electrode 44 is assumed to be at −4 volts, which is the logical "0" state). This causes the voltage at the junction 76 to become negative; the triode 46 also starts to conduct. This, in turn, produces a current flow from the drain electrode 49 to the drain electrode 44 via the triodes 46 and 41. This undesirable conduction reduces the voltage magnitude at the drain electrodes 44 and 49 (the desired voltage is +4 volts at the drain electrode 49, and −4 volts at the drain electrode 44), thereby causing marginal operation.

Such circuit deficiencies are remedied by the utilization of two triodes 101, 111, as shown in FIG. 1. One primary electrode 102, such as a source electrode, of the triode 101 is coupled to one primary electrode 112 (such as a source electrode) of the triode 111. The electrodes 101, 112 are connected together and are coupled to the junction point 76 for coupling to the conductive medium 77. A gate (control) electrode 103 of the triode 101 is coupled to the output of the inverter. Similarly, a gate electrode 113 of the triode 111 is also coupled to the output of the inverter 81. A second primary (drain) electrode 104 of the triode 101 is directly connected to the source electrode 42 of the triode 41. Likewise, a second primary (drain) electrode 114 of the triode 111 is directly connected to the source electrode 47 of the triode 46. It is noted that there is no direct physical connection joining the source electrodes 42, 47 together.

Through the use of the double transistors 101 and 111, when the pulse applied along the lines 78 is high, the transistors 101 and 111 are turned off. Since the transistors 101 and 111 are in series with the transistors 41 and 46, the undesirable conduction between the drain electrodes 44 and 49 are eliminated.

The circuit as described hereinabove is limited in speed due to the stray capacitances at the drain electrodes 44 and 49. When the storage pulse applied along the line 78 is low, the voltages at the drain electrodes 44, 49 are controlled by the input. When the input attempts to put a new value into the latch 14, the differential voltage at the drain electrodes 44, 49 must be discharged to zero and charged to the new value. The process of discharging from ±4 volts to 0 volts consumes most of the time.

The speed is improved by the addition of a transistor (triode) 121, as shown in FIG. 1. The triode 121 has a source electrode 122 coupled to the drain electrode 44 of the triode 41, and has a drain electrode 123 coupled to the drain electrode 49 of the triode 46. A gate electrode 124 is coupled to receive a positive pulse which is applied upon the termination of the pulse applied to the line 78. The pulse applied to the gate 124 is a very narrow pulse and is applied as soon as the pulse along the line 78 is made low. This causes the differential voltage at the drain electrodes 44 and 49 to reach 0 volts very quickly. The amplified version of the analog input completes the charging process when the transistor (triode) 121 is deactivated.

The complete circuit, with improved reliability including the triodes 101, 111, and with improved speed including the triode 121, is the preferred form of the invention.

In summary, the comparator 11 includes two differential amplifiers 12, 13 and a latch 14. The analog input is compared against ground potential by the differential amplifier 12, while the triodes 26, 31 form the pull-up loads. The differential voltage which appears across the drain electrodes 19, 24 is applied through differential amplifier 13 to the latch 14 for storage therein. Storage is accomplished by applying a positive pulse along the line 78 which turns on the triode 67 and turns off the triodes 101, 111. The cross coupled transistor pair 61, 62 flips to a state which is determined by the differential voltage on the stray capacitances of the drain electrodes 44, 49. The latch 14 outputs are applied to a set/reset flip-flop (not shown) which provides a standard logic output.

As heretofore known, the term "triode" was usually defined as a three-element electron tube containing an anode, a cathode, and a control electrode. However, as stated hereinabove, the preferred form of the triodes are solid state devices and, preferably, transistors such as MOSFETs. In one form of the invention, the entire overall circuit is applied in one integrated circuit chip. Thus, as used in the claims, it is the intent that the term "triode" be broadly construed to include any electrode device having a pair of primary electrodes and one control electrode (and, hence, readable on both vacuum tube and solid state technology).

Various modifications of this invention may be performed without departing from the spirit and scope of this invention, as will be apparent to one ordinarily skilled in the art. For example, voltages may be changed, and may be values other than ±4 volts; other semiconductor devices can be used in lieu of MOSFETs. This circuit can be applied in more than one integrated circuit unit.

What is claimed is:

1. An improved comparator circuit utilizing a plurality of triodes, each having a pair of primary electrodes and one control electrode, including
    a first differential amplifier having one primary electrode of a first triode and one primary electrode of a second triode coupled together for coupling to a negative potential source via a first conductive medium, one control electrode of said first triode for receiving an analog input signal, one control electrode of said second triode being coupled to a point of reference potential, a third triode connected as a resistive load for coupling a positive potential source to a second primary electrode of said first triode, and a fourth triode connected as a resistive load for coupling said positive potential source to a second primary electrode of said second triode;
    a second differential amplifier having one primary electrode of a fifth triode and one primary electrode of a sixth triode coupled via suitable means for coupling to said negative potential source via a second conductive medium, one control electrode of said fifth triode being coupled to said second primary electrode of said first triode, one control electrode of said sixth triode being coupled to said second primary electrode of said second triode, a seventh triode connected as a resistive load for coupling said positive potential source to a second primary electrode of said fifth triode, and an eighth triode connected as a resistive load for coupling said positive potential source to a second primary electrode of said sixth triode;
    a latch having one primary electrode of a ninth triode and one primary electrode of a tenth triode coupled together to one primary electrode of an eleventh triode, a second primary electrode of said eleventh triode for coupling to said negative potential source via said second conductive medium, one control electrode of said ninth triode coupled to a second primary electrode of said tenth triode, one control electrode of said tenth triode coupled to a second primary electrode of said ninth triode, said second primary electrode of said ninth triode coupled to said second primary electrode of said fifth triode, said second primary electrode of said tenth triode coupled to said second primary electrode of said sixth triode, and said second primary electrode of said tenth triode, providing a digital output therefrom; and
    a switching circuit including means for receiving a storage pulse for coupling to one control electrode of said eleventh triode, and means for coupling an inverted form of said storage pulse to said suitable means,
    the improvement wherein said suitable means comprises
        a twelfth triode having one control electrode coupled to receive said inverted form of said storage pulse, a first primary electrode coupled to said negative potential source via said second conductive medium, and a second primary electrode coupled to said one primary electrode of said fifth triode; and
        a thirteenth triode having one control electrode coupled to receive said inverted form of said storage pulse, a first primary electrode coupled to said negative potential source via said second conductive medium, and a second primary electrode coupled to said one primary electrode of said sixth triode.

2. The circuit as recited in claim 1 wherein said triodes are solid state.

3. The circuit as recited in claim 1 wherein said triodes are MOSFETs.

4. The circuit as recited in claim 1 further comprising a fourteenth triode having
    a first primary electrode coupled to said second primary electrode of said fifth triode;
    a second primary electrode coupled to said second primary electrode of said sixth triode; and
    a control electrode coupled to receive a trigger pulse upon termination of said storage pulse.

5. The circuit as recited in claim 4 wherein said triodes are solid state.

6. The circuit as recited in claim 4 wherein said triodes are MOSFETs.

7. An improved comparator circuit utilizing a plurality of triodes, each having a pair of primary electrodes and one control electrode, including
    a first differential amplifier having one primary electrode of a first triode and one primary electrode of a second triode coupled together for coupling to a negative potential source via a first conductive medium, one control electrode of said first triode for receiving an analog input signal, one control electrode of said second triode being coupled to a point of reference potential, a third triode connected as a resistive load for coupling a positive potential source to a second primary electrode of said first triode, and a fourth triode connected as a resistive load for coupling said positive potential source to a second primary electrode of said second triode;
    a second differential amplifier having one primary electrode of a fifth triode and one primary electrode of a sixth triode coupled via electronically controlled means for coupling to said negative potential source via a second conductive medium, one control electrode of said fifth triode being coupled to said second primary electrode of said first triode, one control electrode of said sixth triode being coupled to said second primary electrode of said second triode, a seventh triode connected as a resistive load for coupling said positive potential source to a second primary electrode of said fifth triode, and an eighth triode connected as a resistive load for coupling said positive potential source to a second primary electrode of said sixth triode;

a latch having one primary electrode of a ninth triode and one primary electrode of a tenth triode coupled together to one primary electrode of an eleventh triode, a second primary electrode of said eleventh triode for coupling to said negative potential source via said second conductive medium, one control electrode of said ninth triode coupled to a second primary electrode of said tenth triode, one control electrode of said tenth triode coupled to a second primary electrode of said ninth triode, said second primary electrode of said ninth triode coupled to said second primary electrode of said fifth triode, said second primary electrode of said tenth triode coupled to said second primary electrode of said sixth triode, and said second primary electrode of said tenth triode providing a digital output therefrom; and a switching circuit including means for receiving a storage pulse for coupling to one control electrode of said eleventh triode, and means for coupling an inverted form of said storage pulse to said electronically controlled means to inhibit current conduction therethrough, the improvement further comprising an additional triode having a first primary electrode coupled to said second primary electrode of said fifth triode;

a second primary electrode coupled to said second primary electrode of said sixth triode; and a control electrode coupled to receive a trigger pulse upon termination of said storage pulse.

8. The circuit as recited in claim 7 wherein said triodes are solid state.

9. The circuit as recited in claim 7 wherein said triodes are MOSFETs.

10. The circuit as recited in claim 9 wherein said control electrodes are gate electrodes, one primary electrode of each of said triodes is a source electrode, and the other primary electrode of each of said triodes is a drain electrode.

* * * * *